United States Patent
Neu et al.

(10) Patent No.: US 6,469,086 B1
(45) Date of Patent: Oct. 22, 2002

(54) PLASTIC MOLDING COMPOUND, COMPOSITE BODY, AND FILLER FOR A PLASTIC MOLDING COMPOUND

(75) Inventors: Achim Neu, Regensburg; Alexandra Atzesdorfer, Weil Am Rhein; Thies Janczek, Flintbek, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/596,423

(22) Filed: Jun. 19, 2000

Related U.S. Application Data

(63) Continuation of application No. PCT/DE98/03661, filed on Dec. 14, 1998.

(30) Foreign Application Priority Data

Dec. 19, 1997 (DE) .......................... 197 56 887

(51) Int. Cl.[7] .............................. C08K 3/38; C08K 3/10
(52) U.S. Cl. ..................... 524/404; 524/403; 524/413; 524/428; 524/430; 428/457
(58) Field of Search .................. 428/457; 524/403, 524/404, 413, 428, 430

(56) References Cited

U.S. PATENT DOCUMENTS

| | | | |
|---|---|---|---|
| 5,037,876 A | * | 8/1991 | Birkle et al. ................ 524/496 |
| 5,907,190 A | * | 5/1999 | Ishikawa et al. ............. 257/795 |
| 5,989,942 A | * | 11/1999 | Ishikawa et al. ............. 438/127 |

FOREIGN PATENT DOCUMENTS

| | | |
|---|---|---|
| DE | 4037972 A1 | 6/1991 |
| EP | 0394767 A2 | 10/1990 |
| EP | 0714125 A3 | 5/1996 |
| EP | 0714125 A2 | 5/1996 |

OTHER PUBLICATIONS

Japanese Patent Abstract No. 09067553 A (Yutaka et al.), dated Mar. 11, 1997.

"Neue Leitklebstoffe für Anwendungen in der Mikroelektronik", Gert Tetzner et al., kleben & dichten Adhäsion, May 1998, pp. 10–14.

* cited by examiner

*Primary Examiner*—Kriellion A. Sanders
(74) *Attorney, Agent, or Firm*—Laurence A. Greenberg; Werner H. Stemer; Ralph E. Locher

(57) ABSTRACT

An integrated circuit has a lead frame, on which a chip of a semiconductor material is attached by a layer of adhesive. The layer of adhesive has at least one filler and a plastic material. The filler is formed of spherical nanoscale particles produced by a condensation process, which may be conductive or insulating. It is also possible to provide the chip with a sheathing which has such fillers.

31 Claims, 1 Drawing Sheet

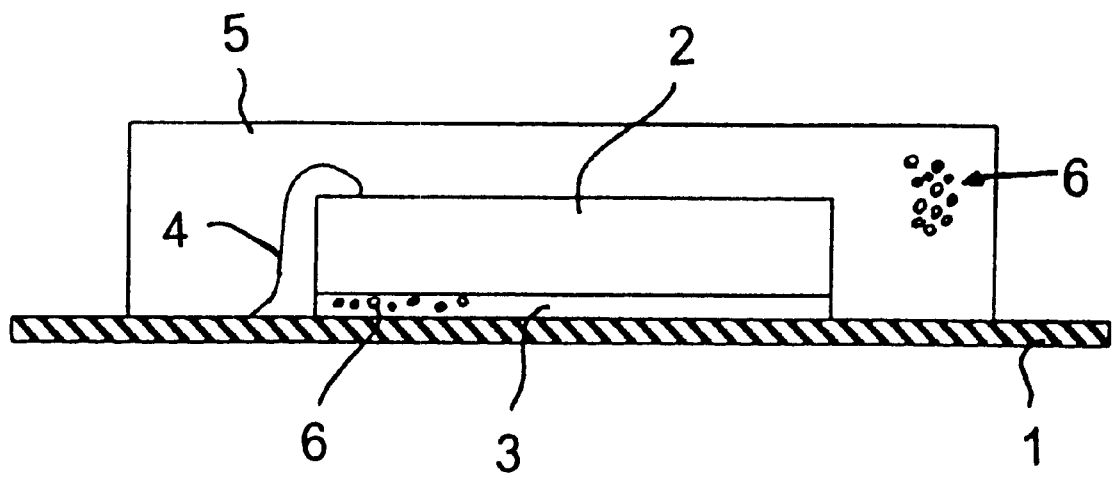

PLASTIC MOLDING COMPOUND, COMPOSITE BODY, AND FILLER FOR A PLASTIC MOLDING COMPOUND

CROSS-REFERENCE TO RELATED APPLICATION

This is a continuation of copending international application PCT/DE98/03661, filed Dec. 14, 1998, which designated the United States.

BACKGROUND OF THE INVENTION

FIELD OF THE INVENTION

The invention relates to plastic composite bodies such as electrical components which have a body of a semiconductor material, for example a microchip.

It has been known to attach microchips by a layer of chip-attaching adhesive onto conductive supporting frames, which are known as lead frames. These lead frames are then attached by means of conductive adhesive or by soldering to conductor tracks on a printed-circuit board.

In the case of plastic composite bodies such as in the case of semiconductor devices which have a basic body of metal, such as a lead frame for example, and a body of semiconductor material, such as a microchip for example, undesired failures often occur under actual environmental conditions. This is also attributed to inadequate heat dissipation from the microchip.

U.S. Pat. No. 5,037,876 (European published patent application EP 0 394 767) discloses a plastic molding compound which has a plastic material and a filler. The filler contains nanoscale particles.

Patent Abstracts of Japan vol. 097, no. 007, Jul. 31, 1997 discloses a plastic molding compound. The plastic molding compound has a filler and a plastic material. The filler contains nanoscale particles. In addition, the document discloses a composite body which comprises a basic body and a chip attached on the basic body by means of a layer of adhesive. The layer of adhesive has a filler and a plastic material, with the filler containing ceramic nanoscale particles.

U.S. Pat. Nos. 5,907,190 and 5,989,942 (European published patent application EP 0 714 125) disclose a plastic molding compound which has a filler and a plastic material. The filler contains nanoscale particles. Particle sizes of 10 nm and 100 nm are specified.

SUMMARY OF THE INVENTION

The object of the invention is to provide a plastic composite body which overcomes the deficiencies and disadvantages of the prior art devices and methods of this kind, and which ensure reliable operation even under high thermal loading.

With the above and other objects in view there is provided, in accordance with the invention, a plastic molding compound, comprising:

a proportion of at least one plastic material, in particular a thermosetting material; and at least one filler in the plastic material, the filler having nanoscale, spherical particles produced by a condensation process.

In accordance with an added feature of the invention, the particles have a size in a range of up to 1000% a size of oligomeric compounds of the plastic material.

In accordance with an additional feature of the invention, the particles have a size in a range of up to 40 nm.

In accordance with another feature of the invention, the filler contains ceramic particles. Preferably, the particles are aluminum oxide, boron nitride, and/or aluminum nitride particles.

In accordance with a further feature of the invention, the filler contains metallic particles. Preferred metallic particles are selected from metallic particles with silver, palladium, and/or copper.

With the above and other objects in view there is also provided, in accordance with the invention, a composite body, comprising:

a basic body;

a chip of a semiconductor material mounted on the basic body;

a layer of adhesive attaching the chip on the basic body, the layer of adhesive having at least one plastic material and at least one filler with nanoscale, spherical particles produced by a condensation process.

There is further provided a filler for a plastic molding compound for the solid bonding of semiconductor bodies to other materials, such as metal, and or for sheathing semiconductor bodies with the plastic molding compound. The filler comprising nanoscale, spherical particles produced by a condensation process and dispersed in the plastic molding compound.

In accordance with a concomitant variation of the invention, there is also provided a composite body, in particular an integrated circuit, comprising:

a semiconductor chip;

a basic body of metal carrying the semiconductor chip; and a sheathing encasing the semiconductor chip, the sheathing being formed of a plastic material and a filler in the plastic material, the filler having spherical nanoscale particles produced by a condensation process.

According to the invention, a plastic molding compound is provided, in particular for the solid bonding of semiconductor bodies to other materials such as metal and/or for sheathing semiconductor bodies. The plastic molding compound has at least one plastic material, which may be a thermosetting or a thermoplastic material, with at least one filler being incorporated in the plastic material. At the same time, the filler or at least one of the fillers, has nanoscale, in particular spherical, particles produced by a condensation process.

A new physical vaporizing technology makes it possible to produce particles which are smaller than 100 nm. The particles are produced spherically by condensation, the type of compound being determinable by the use of specific process gases. In this way, it is possible to produce oxides, nitrides etc. of a particularly small size.

Use in the plastic molding compound according to the invention leads to numerous advantages.

When used in semiconductor technology, an electrical component is protected against mechanical and chemical influences by the plastic molding compound according to the invention. In this case, a semiconductor chip is encapsulated in an injection-molding process together with its contacting assembly, for example with a lead frame, by a compression molding compound based for example on epoxy resin, under the effect of pressure and temperature. Finally, only the terminal wires are left protruding out of the housing produced in this way, and these are electroplated and bent over in order to form a finished "package" as it is known.

The plastic molding compound according to the invention can be provided with a high proportion of filler, so that only a small proportion of expensive base resin is necessary. In this case, good flow properties are advantageously provided in the molding tool, producing the advantage that the package and the terminal wires are not damaged or displaced in the injection-molding process.

When the plastic molding compound according to the invention is used, optimizing the incorporation of the filler into the compression molding compound and fine-tuning the tool design and the injection-molding parameters is made significantly easier. This is so because the particles do not represent a mechanical obstacle to the epoxy resin. As a result, the flow behavior of the compression molding compound is improved in the mold flow.

This increases the service life of the molding tool, since the gate is subjected to little wear by smaller particles. The mechanical loading of the wires and chips decreases, since the particles flow more easily around the chip, representing an obstacle. The filler content of the plastic molding compound according to the invention is increased by the use of nanospheres, resulting in a lower coefficient of thermal expansion.

The plastic molding compound according to the invention may also be used as a so-called diebonding adhesive with a high filler content, whereby a high thermal conductivity is achieved, for example for mounting power semiconductor devices on metallic lead frames. This makes it possible to dispense with mounting techniques involving more difficult process technology, such as soldering or ligation. This is because the use of nanoscale fillers allows higher proportions of filler in adhesives. Moreover, the thermal conductivity of a layer of adhesive produced with a plastic molding compound according to the invention can also be varied and specific use when there is a definite requirement concerning thermal conductivity is possible.

The size of the particles may preferably be in a range up to 1000% of the size of oligomeric compounds of the plastic material, since this results in a particularly good incorporation of the particles into a plastic material that is in the crosslinking process, whereby a dense packing of the plastic material with at the same time closed resin coverage of the particles is ensured. An oligomeric compound of the plastic material is to be understood here as meaning an intermediate state between the monomeric state of the plastic material and the polymeric or completely crosslinked state of the plastic material.

According to the invention, typical particle sizes are less than 1 $\mu$m and preferably provided in the range of less than 40 nm. Currently, particles with a size to below 10 nm can be provided. Even smaller particles are conceivable.

If the filler or one of the fillers has ceramic particles, the plastic molding compound according to the invention can be used to provide a layer of electrically insulating adhesive. Aluminum oxides $Al_2O_3$, boron nitride BN, and/or aluminum nitride AlN are preferably used. This produces a layer of adhesive with good thermal conductivity, which is suitable for electrically insulating a semiconductor device from a lead frame.

The filler may also have metallic particles. This allows the plastic molding compound according to the invention to be used for producing layers of adhesive by which a semiconductor device is connected electrically conductively to a lead frame. By controlling the mixing ratio of electrically conductive particles to electrically insulating particles, the resistance of a layer of adhesive can also be set, ensuring good thermal conductivity. Currently, silver, palladium and/or copper are preferably used as metal particles.

The invention is also realized in a composite body which in particular constitutes an integrated circuit. The composite body has a basic body, in particular of a metal, and a chip of a semiconductor material that is attached on the basic body by means of a layer of adhesive, the layer of adhesive being produced from the plastic molding compound according to the invention. The invention accordingly also comprises use of the plastic molding compound according to the invention in a production process for the solid bonding of semiconductor bodies to other materials such as metal. This results in use as a diebonding adhesive with a high proportion of filler.

The invention also comprises a composite body and, in particular, an integrated circuit which has a chip of a semiconductor material, a basic body, in particular of metal, and a sheathing. The sheathing has a filler and a plastic material as are used in the plastic molding compound according to the invention.

The invention accordingly also comprises use of the plastic molding compound according to the invention for sheathing semiconductor bodies in order to form a housing.

This preferably involves producing packages of which the sheathing or housing consists of a biphenyl-based compression molding compound with a filler which has $SiO_2$ as nanoscale-spherical particles with diameters of approximately 30 nm.

Other features which are considered as characteristic for the invention are set forth in the appended claims.

Although the invention is illustrated and described herein as embodied in a plastic composite body, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be even better understood from the following description of a specific embodiment when read in connection with the accompanying drawing.

BRIEF DESCRIPTION OF THE DRAWING

The FIGURE of the drawing is a diagrammatic sectional view of a semiconductor package.

DESCRIPTION OF A PREFERRED EMBODIMENT

Referring now to the FIGURE of the drawing in detail, there is seen a composite semiconductor body. A leadframe 1 forms a metallic basic body. A semiconductor chip 2 is glued to the leadframe 1 with a layer 3 of adhesive. The adhesive has at least one plastic material and at least one filler with nanoscale, spherical particles 6 produced by a condensation process. The chip 2 is electrically connected to the leads on the leadframe via bonding wires 4.

The semiconductor body forms a complete package with sheathing 5 that is also formed of at least one filler and a plastic material, in particular a thermosetting material. The filler, i.e., at least one of the fillers has spherical nanoscale (with size dimensions in the nano order of magnitude) particles 6 which are produced by a condensation process.

We claim:

1. A plastic molding compound, comprising:
   a proportion of at least one plastic material; and
   at least one filler in said plastic material, said filler having nanoscale, spherical particles produced by a condensation process.

2. The plastic molding compound according to claim 1, wherein said plastic material is a thermosetting material.

3. The plastic molding compound according to claim 1, wherein oligomeric compounds with a given size are formed from said plastic material and said particles have a size in a range of up to 1000% the given size of the oligomeric compounds of the plastic material.

4. The plastic molding compound according to claim 1, wherein said particles have a size in a range of up to 40 nm.

5. The plastic molding compound according to claim 1, wherein said filler contains ceramic particles.

6. The plastic molding compound according to claim 5, wherein said particles include a materials elected from the group consisting of aluminum oxide, boron nitride, and aluminum nitride.

7. The plastic molding compound according to claim 1, wherein said filler contains metallic particles.

8. The plastic molding compound according to claim 7, wherein the particles contain a metal selected from the group consisting of silver, palladium, and copper.

9. A composite body, comprising:
   a basic body;
   a chip of a semiconductor material mounted on said basic body;
   a layer of adhesive attaching said chip on said basic body, said layer of adhesive having at least one plastic material and at least one filler with nanoscale, spherical particles produced by a condensation process.

10. The composite body according to claim 9, wherein said plastic material is a thermosetting material.

11. The composite body according to claim 9, wherein said basic body is a metal body.

12. The composite body according to claim 9, wherein oligomeric compounds with a given size are formed from said plastic material and said particles have a size in a range of up to 1000% the given size of the oligomeric compounds of the plastic material.

13. The composite body according to claim 9, wherein said particles have a size in a range of up to 40 nm.

14. The composite body according to claim 9, wherein said filler contains ceramic particles.

15. The composite body according to claim 14, wherein said particles include a material selected from the group consisting of aluminum oxide, boron nitride, and aluminum nitride.

16. The composite body according to claim 9, wherein said filler contains metallic particles.

17. The composite body according to claim 16, wherein the particles contain a metal selected from the group consisting of have silver, palladium, and copper.

18. A filler for a plastic molding compound for the solid bonding of semiconductor bodies to other materials, the filler comprising nanoscale, spherical particles produced by a condensation process and dispersed in the plastic molding compound.

19. A filler for a plastic molding compound for sheathing semiconductor bodies with the plastic molding compound, the filler comprising nanoscale, spherical particles produced by a condensation process and dispersed in the plastic molding compound.

20. The filler according to claim 19, wherein said plastic material forms oligomeric compounds with a given size and said particles have a size in a range of up to 1000% the given size of the oligomeric compounds of the plastic material.

21. The filler according to claim 19, wherein said particles have a size in a range of up to 40 nm.

22. The filler according to claim 19, wherein said filler contains ceramic particles.

23. The filler according to claim 22, wherein said particles include a material selected from the group consisting of aluminum oxide, boron nitride, and aluminum nitride.

24. The filler according to claim 19, wherein said filler contains metallic particles.

25. The filler according to claim 24, wherein the particles contain a metal selected from the group consisting of silver, palladium, and copper.

26. A composite body, comprising:
   a semiconductor chip;
   a basic body of metal carrying said semiconductor chip; and
   a sheathing encasing said semiconductor chip, said sheathing being formed of a plastic material and a filler in said plastic material, said filler having spherical nanoscale particles produced by a condensation process.

27. The composite body according to claim 26, wherein said plastic material is a thermosetting material.

28. The composite body according to claim 26, wherein said plastic material forms oligomeric compounds with a given size and said particles have a size in a range of up to 1000% the given size of the oligomeric compounds of the plastic material.

29. The composite body according to claim 26, wherein said particles have a size in a range of up to 40 nm.

30. The composite body according to claim 26, wherein said filler contains ceramic particles.

31. The composite body according to claim 30, wherein said particles include a material selected from the group consisting of aluminum oxide, boron nitride, and aluminum nitride.

* * * * *